United States Patent
Nakano et al.

(10) Patent No.: US 11,069,612 B2
(45) Date of Patent: *Jul. 20, 2021

(54) SEMICONDUCTOR DEVICES HAVING ELECTRICALLY AND OPTICALLY CONDUCTIVE VIAS, AND ASSOCIATED SYSTEMS AND METHODS

(71) Applicant: Micron Technology, Inc., Boise, ID (US)

(72) Inventors: Eiichi Nakano, Boise, ID (US); Mark E. Tuttle, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/702,811

(22) Filed: Dec. 4, 2019

(65) Prior Publication Data

US 2020/0126907 A1 Apr. 23, 2020

Related U.S. Application Data

(63) Continuation of application No. 16/182,901, filed on Nov. 7, 2018, now Pat. No. 10,529,659, which is a
(Continued)

(51) Int. Cl.
*H01L 23/522* (2006.01)
*H01L 23/48* (2006.01)
(Continued)

(52) U.S. Cl.
CPC .... *H01L 23/5226* (2013.01); *H01L 21/76802* (2013.01); *H01L 21/76898* (2013.01);
(Continued)

(58) Field of Classification Search
CPC .................................................. H01L 23/5226
See application file for complete search history.

(56) References Cited

U.S. PATENT DOCUMENTS

| 5,652,811 A | 7/1997 | Cook et al. |
| 6,839,108 B1 | 1/2005 | Hirakata et al. |
| (Continued) | | |

FOREIGN PATENT DOCUMENTS

| CN | 105321906 A | 2/2016 |
| JP | 2009158866 A | 7/2009 |
| (Continued) | | |

OTHER PUBLICATIONS

International Application No. PCT/US2018/046819—International Search Report and Written Opinion, dated Dec. 18, 2018, 9 pages.
(Continued)

*Primary Examiner* — William Coleman
(74) *Attorney, Agent, or Firm* — Perkins Coie LLP

(57) ABSTRACT

Semiconductor devices having one or more vias filled with a transparent and electrically conductive material are disclosed herein. In one embodiment, a semiconductor device includes a first semiconductor die stacked over a second semiconductor die. The first semiconductor die can include at least one via that is axially aligned with a corresponding via of the second semiconductor die. The vias of the first and second semiconductor dies can be filled with a transparent and electrically conductive material that both electrically and optically couples the first and second semiconductor dies.

21 Claims, 5 Drawing Sheets

Related U.S. Application Data continuation of application No. 15/852,339, filed on Dec. 22, 2017, now Pat. No. 10,141,259.

(51) Int. Cl.
*H01L 21/768* (2006.01)
*H05K 1/11* (2006.01)
*H01L 23/528* (2006.01)
*H01L 23/532* (2006.01)
*H01L 25/065* (2006.01)
*H01L 27/146* (2006.01)

(52) U.S. Cl.
CPC ........ *H01L 23/481* (2013.01); *H01L 23/5283* (2013.01); *H01L 23/53209* (2013.01); *H01L 23/53295* (2013.01); *H01L 25/065* (2013.01); *H05K 1/115* (2013.01); *H01L 27/14636* (2013.01)

(56) References Cited

U.S. PATENT DOCUMENTS

| | | | |
|---|---|---|---|
| 8,290,319 | B2 | 10/2012 | Harada et al. |
| 8,854,589 | B2 | 10/2014 | Nirmal et al. |
| 10,141,259 | B1 | 11/2018 | Nakano et al. |
| 10,529,659 | B2 * | 1/2020 | Nakano ............. H01L 23/53209 |
| 2004/0091719 | A1 | 5/2004 | Uchida |
| 2006/0079019 | A1 | 4/2006 | Kim |
| 2010/0267176 | A1 | 10/2010 | Liu et al. |
| 2012/0051695 | A1 | 3/2012 | Harada et al. |
| 2014/0035153 | A1 | 2/2014 | Mohammed |
| 2014/0203451 | A1 | 7/2014 | Kwon et al. |
| 2014/0211056 | A1 | 7/2014 | Fan |
| 2014/0268980 | A1 | 9/2014 | Kim et al. |
| 2016/0035649 | A1 | 2/2016 | Lee |
| 2017/0358562 | A1 | 12/2017 | Banna et al. |
| 2019/0198443 | A1 | 6/2019 | Nakano et al. |

FOREIGN PATENT DOCUMENTS

| | | |
|---|---|---|
| TW | 201130060 A | 9/2011 |
| TW | 201714289 A | 4/2014 |

OTHER PUBLICATIONS

TW Patent Application No. 107130230—Taiwanese Search Report, dated Mar. 28, 2019, with English Translation, 2 pages.
CN Patent Application No. 201880045251.8—Chinese Office Action and Search Report, dated Jun. 3, 2020, with English Translation, 16 pages.

* cited by examiner

SEMICONDUCTOR DEVICES HAVING ELECTRICALLY AND OPTICALLY CONDUCTIVE VIAS, AND ASSOCIATED SYSTEMS AND METHODS

CROSS-REFERENCE TO RELATED APPLICATIONS

This application is a continuation of U.S. application Ser. No. 16/182,901, filed Nov. 7, 2018; which is a continuation of U.S. application Ser. No. 15/852,339, filed Dec. 22, 2017, now U.S. Pat. No. 10,141,259; each of which is incorporated herein by reference in its entirety.

TECHNICAL FIELD

The present technology generally relates to semiconductor devices, and more particularly relates to semiconductor devices having one or more vias with a transparent and electrically conductive material disposed therein.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies and yet increase the capacity and/or speed of the resulting encapsulated assemblies. To meet these demands, semiconductor die manufacturers often stack multiple semiconductor dies vertically on top of each other to increase the capacity or performance of a microelectronic device within the limited volume on the circuit board or other element to which the semiconductor dies are mounted. In some semiconductor die stacks, the semiconductor dies are electrically interconnected using through silicon vias (TSVs). The TSVs enable the semiconductor dies to be stacked close to each other such that adjacent semiconductor dies are spaced apart from each other by only relatively small vertical distances. This enables higher data transfer rates and, since the dies are stacked vertically, the total footprint of the stack corresponds to the footprint of the largest die in the stack.

One concern with microelectronic devices having stacked semiconductor dies is that increasing the TSV count of each semiconductor die in the stack often requires increasing the size of the semiconductor dies. However, it is often desirable to increase the TSV count to, for example, improve power delivery to the stacked dies and/or improve data transfer between the dies. Accordingly, there remains a need in the art for methods and systems for improving the density or number of TSVs in a microelectronic device having stacked dies without increasing the size of the stacked dies.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
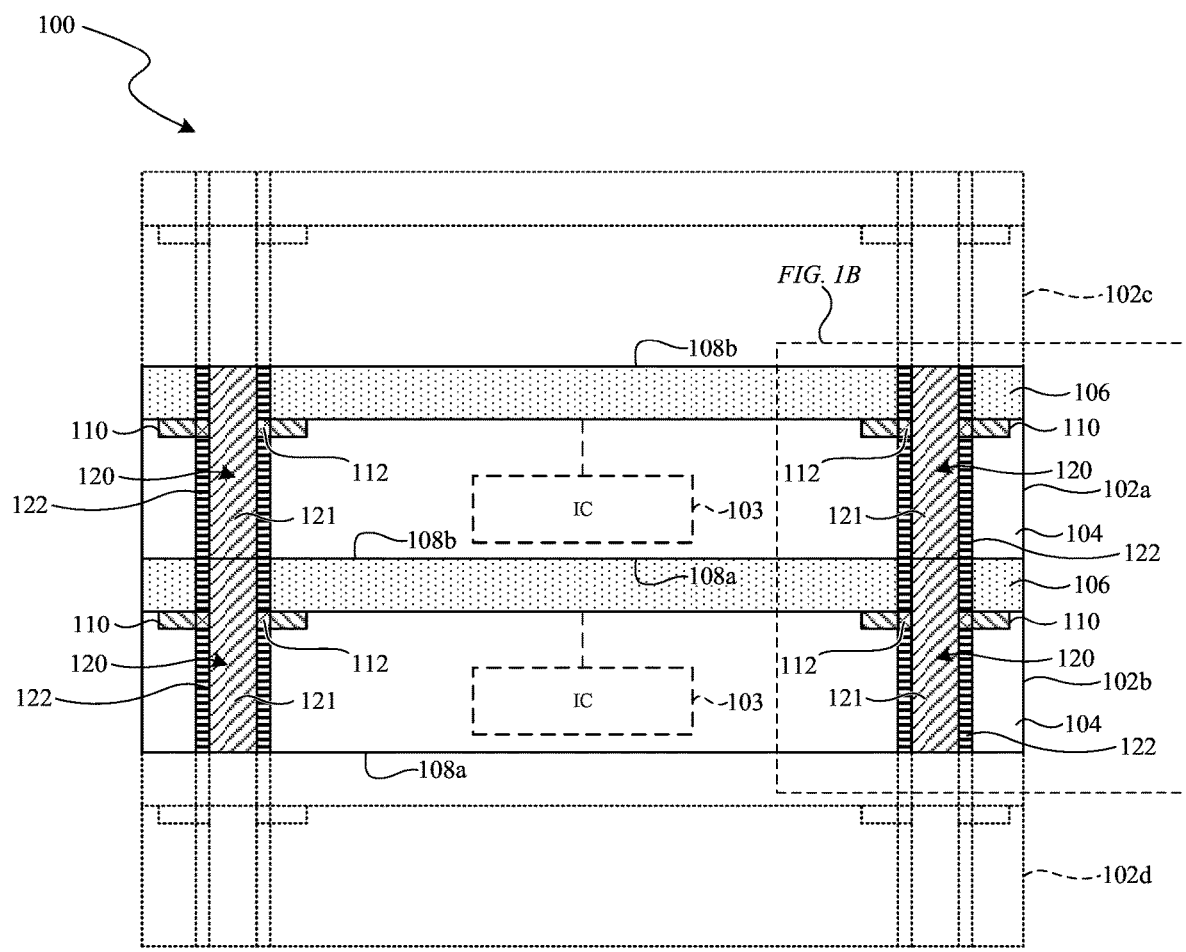
FIG. 1A is a cross-sectional view.

Specific details of several embodiments of semiconductor devices having optically and electrically conductive vias are described below. A person skilled in the relevant art will recognize that suitable steps of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-4.

In several of the embodiments described below, a semiconductor device includes a first semiconductor die having a first optical component and a second semiconductor die having a second optical component. A via extends at least between the first and second optical components and has a transparent and electrically conductive material disposed therein. In some embodiments, the first and second semiconductor dies are electrically and optically coupled through the transparent and electrically conductive material in the via. For example, the first and second optical components can be configured to receive and/or transmit optical signals along the via between the first and second semiconductor dies. At the same time, the via can be coupled to a power source, a ground, or another source of electrical signals. Therefore, the present technology can advantageously increase the signal density that a single via is capable of carrying by configuring the via to transmit both electrical and optical signals. Accordingly, the present technology can reduce the area of a semiconductor die that is occupied by, for example, through silicon vias (TSVs), or maintain the same area while improving data transfer, power delivery, and/or other characteristics of a semiconductor device incorporating the semiconductor die.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a cross-sectional view of a semiconductor device 100 having optically and electrically conductive vias configured in accordance with an embodiment of the present technology. The semiconductor device 100 includes a first semiconductor die 102a and a second semiconductor die 102b (collectively "semiconductor dies 102") adjacent to the first semiconductor die 102a. In the embodiment illustrated in FIG. 1A, the semiconductor device 100 includes two semiconductor dies stacked "front-to-back" (e.g., an active side of the second semiconductor die 102b faces a backside of the first semiconductor die 102a that is opposite an active side of the first semiconductor die 102a). In practice the semiconductor device 100 can include a different number of semiconductor dies, such as three dies, four dies, eight dies, sixteen dies, or more. For example, in another embodiment, the semiconductor device 100 can include a third semiconductor die 102c (shown in hidden lines) above the first semiconductor die 102a, and a fourth semiconductor die 102d (shown in hidden lines) below the second semiconductor die 102b. Likewise, as described in further detail with reference to FIGS. 2A-3, the semiconductor dies 102 may have other suitable orientations such as "front-to-front."

Each of the semiconductor dies 102 includes integrated circuitry 103, a substrate 104 (e.g., a silicon substrate), and a connection layer 106 on a surface of the substrate 104. The integrated circuitry 103 can include, for example, a memory circuit (e.g., a dynamic random memory (DRAM)), a controller circuit (e.g., a DRAM controller), a logic circuit, and/or other circuits. In some embodiments, the semiconductor dies 102 can be identical (e.g., memory dies manufactured to have the same design and specifications), while in other embodiments the semiconductor dies 102 can be different from each other (e.g., different types of memory dies or a combination of controller, logic, memory, and/or other dies). In certain embodiments, the semiconductor device 100 can include other structures and features such as a casing (e.g., a thermally conductive casing) that encloses the semiconductor dies 102 within an enclosure; an interposer, a printed circuit board, and/or another substrate carrying the semiconductor dies 102; and/or an underfill material deposited or otherwise formed around and/or between all or a portion of the semiconductor dies 102.

Figure 1B:
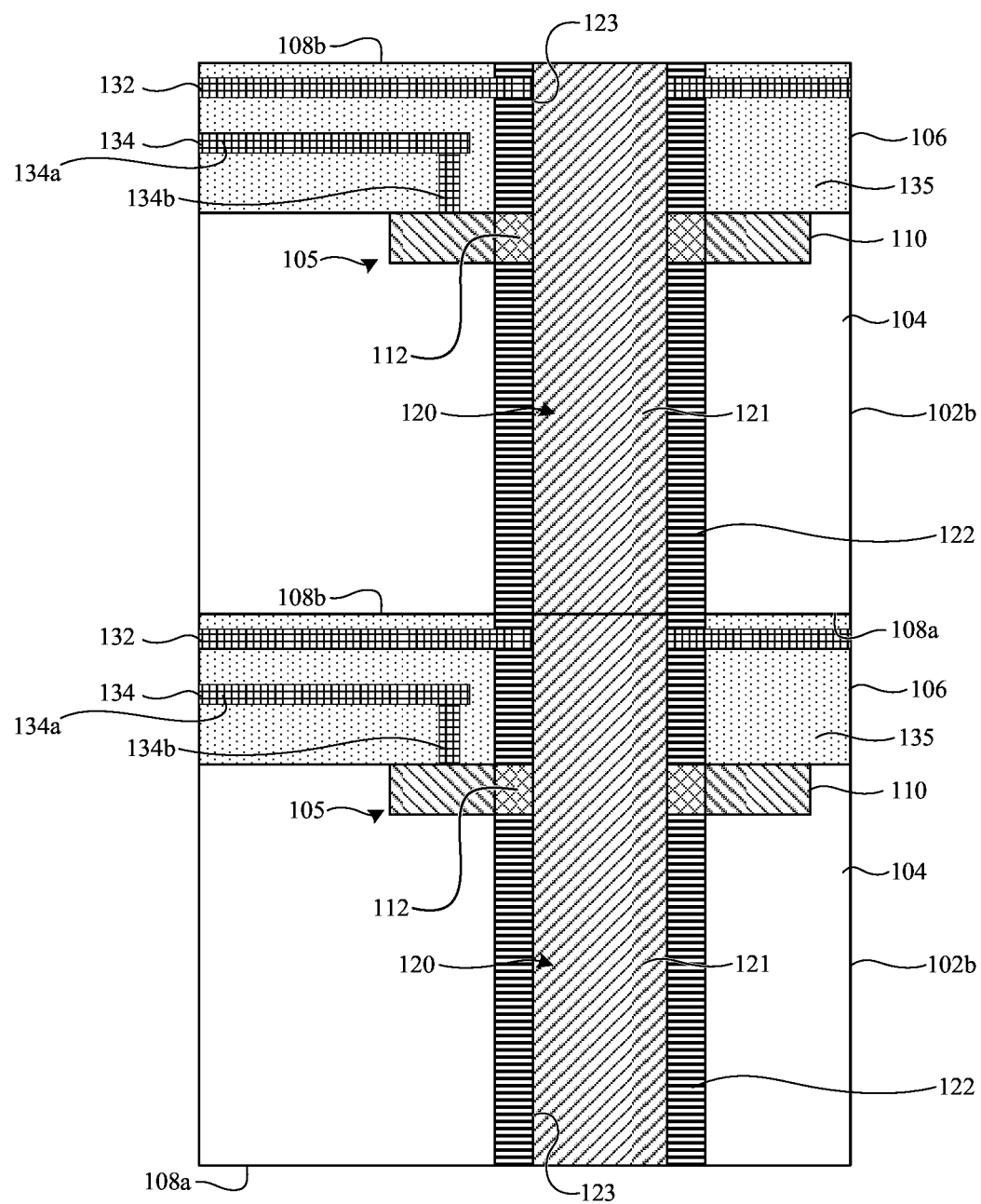
FIG. 1B is an enlarged cross-sectional view, of a semiconductor device in accordance with embodiments of the present technology.

As further illustrated in the embodiment of FIG. 1A, each of the semiconductor dies 102 includes vias 120 (e.g., through-substrate vias or through-silicon vias) extending through the connection layer 106 and the substrate 104 from a first side 108a to a second side 108b of the semiconductor dies 102. More particularly, FIG. 1B is an enlarged cross-sectional view of a portion of the semiconductor dies 102 showing an individual via 120 of the first semiconductor die 102a and an individual via 120 of the second semiconductor die 102b in accordance with an embodiment of the present technology. With reference to FIGS. 1A and 1B, the vias 120 each have a sidewall 123 that defines a cavity or opening filled with an optically and electrically conductive material 121 ("conductive material 121"). In some embodiments, the conductive material 121 is a transparent metal. In certain embodiments the conductive material 121 is a metal oxide such as, for example, indium tin oxide. In the embodiment illustrated in FIGS. 1A and 1B, the vias 120 are generally cylindrical, having a generally circular cross-sectional shape. However, in other embodiments, the vias 120 can have any other suitable shape such as, for example, a rectangular, square, polygonal, and/or other cross-sectional shape. Likewise, the semiconductor dies 102 can include a greater number of vias 120 than the two vias 120 illustrated in the embodiment shown in FIG. 1A. For example, the semiconductor dies 102 can each include one, three, four, or more than four vias.

As shown in FIGS. 1A and 1B, when the first semiconductor die 102a is positioned adjacent (e.g., stacked over) the second semiconductor die 102b, the vias 120 that extend through the first semiconductor die 102a can be aligned with (e.g., axially aligned with) corresponding vias 120 of the second semiconductor die 102b such that the conductive material 121 extends substantially continuously between the semiconductor dies 102. That is, a lower end portion of the conductive material 121 in the vias 120 of the first semiconductor die 102a can contact (e.g., abut) an upper end portion of the conductive material 121 in the corresponding vias 120 of the second semiconductor die 102b. Accordingly, the vias 120 can provide a continuous optical and electrical path between the semiconductor dies 102. In some embodiments, only a subset of the vias 120 of the semiconductor dies 102 may be aligned such that they create an optical and electrical path between the semiconductor dies 102. In certain embodiments, the semiconductor device 100 may include one or more interconnect structures between the semiconductor dies 102. For example, interconnect structures (e.g., bumps, pillars, etc.) can be disposed between the vias 120 of the semiconductor dies 102 and configured to provide an optical and electrical connection between the vias 120.

The vias 120 can be formed using well known processes in the art. For example, the vias 120 can be fabricated by forming holes in the substrate 104 and/or the connection layer 106 of the semiconductor dies 102, filling the holes with the conductive material 121, and then thinning the substrate 104 at the first side 108a (e.g., a backside) to expose the conductive material 121 through the backside of the substrate 104. The process for forming the holes can include a photolithographic process followed by one or more wet and/or dry chemical etch processes. In other embodiments, the semiconductor dies 102 can first be positioned adjacent to each other (e.g., stacked), and the vias 120 can be formed through both of the semiconductor dies 102 at the same time (e.g., as a single via through the stack).

Each of the semiconductor dies 102 can further include optical components 110 optically coupled to corresponding ones of the vias 120. In some embodiments, the optical components 110 can be optical transceivers configured to receive and transmit optical signals by way of the vias 120, photodiodes configured to receive optical signals from the vias 120, light-emitting diodes (LEDs) or other light sources configured to transmit optical signals through the vias 120, or some combination thereof. In certain embodiments, the optical components 110 are optical transceivers that permit direct two-way signal transfer between the semiconductor dies 102 along a single pair of adjacent (e.g., aligned) vias 120. In other embodiments, the optical components 110 can include a combination of LEDs and photodiodes that allow for one-way communication between the semiconductor dies 102—and/or between external circuitry (e.g., external light sources)—along a single pair of adjacent vias 120.

In the embodiment illustrated in FIGS. 1A and 1B, the optical components 110 (i) are each formed in a recess 105 of the substrate 104 of one of the semiconductor dies 102 and (ii) have an annular shape such that they surround or substantially surround a portion of the vias 120. The recesses 105 can be formed, for example, by a suitable etching or other process for removing a portion of the substrate 104 before formation of the connection layer 106. In other embodiments, all or a portion of the optical components 110 can be formed on the surface of the substrate 104. Moreover, the optical components 110 can have other shapes and configurations. For example, multiple optical components 110 might surround a corresponding via 120 (e.g., a photodiode and a LED), and/or the optical components 110 may only partially surround (e.g., be positioned adjacent to) the vias 120.

The optical components 110 can comprise gallium arsenide, a different semiconductor material, and/or another suitable material or combination of materials. In some embodiments, the optical components 110 can be formed by first forming a layer of semiconductor material on the surface of the substrate 104 and/or in the recesses 105 of the semiconductor dies 102 (e.g., using an epitaxial growth process), and then selectively removing portions of the semiconductor material. For example, in certain embodiments, the holes for the vias 120 can be formed (e.g., etched) through the layer of semiconductor material.

In the embodiment illustrated in FIGS. 1A and 1B, the optical components 110 are positioned off an optical axis of the vias 120. Therefore, each of the semiconductor dies 102 can include optical elements 112 configured to direct (e.g., route) optical signals from/to the optical components 110 to/from the vias 120. The optical elements 112 can be waveguides, diffraction gratings, or other suitable structures well known in the art for optically coupling the optical components 110 to the transparent conductive material 121 disposed in the vias 120. As shown, the optical elements 112 can be positioned in the recesses 105 of the semiconductor dies 102 between the optical components 110 and the conductive material 121. In other embodiments, the optical elements 112 can be positioned differently with respect to the optical components 110 and the conductive material 121 (e.g., on the surface of the substrates 104).

In some embodiments, each of the semiconductor dies 102 can further have an insulating layer 122 formed at least partially between the substrate 104 and the conductive material 121, and/or between the connection layer 106 and the conductive material 121. For example, the insulating layer 122 can be formed between the substrate 104 of the semiconductor dies 102 and the conductive material 121 to electrically insulate the conductive material 121 from the substrate 104 which can, for example, comprise silicon and/or another semiconductor material. In certain embodiments, as described in further detail below, the connection layer 106 can include another insulating material positioned adjacent to the conductive material 121 such that the insulating layer 122 need not extend between the connection layer 106 and the conductive material 121.

In addition to insulating portions of the semiconductor dies 102 from the conductive material 121, in some embodiments, the insulating layer 122 can be configured to facilitate the transmission of optical signals through the vias 120. For example, the insulating layer 122 can have a lower index of refraction than the conductive material 121 such that the insulating layer 122 at least partially acts as an optical waveguide for optical signals transmitted through the conductive material 121. In some embodiments, the insulating layer 122 comprises a nitride (e.g., silicon nitride), an oxide, or another suitable insulating material. In certain embodiments, the insulating layer 122 can be formed during the process or processes used to form the vias 120. For example, after forming holes in the substrate 104 and/or the connection layer 106 of the semiconductor dies 102, an insulating material can be deposited in the holes to form the insulating layer 122 prior to deposition (e.g., plating, sputter deposition, etc.) of the conductive material 121.

As illustrated in the embodiment of FIG. 1B, the connection layer 106 of each the semiconductor dies 102 includes one or more layers of a dielectric material 135, a first conductive layer 132, and a second conductive layer 134 (collectively "conductive layers 132, 134"). The dielectric material 135 electrically isolates the conductive layers 132, 134 from each other. The first conductive layer 132 electrically couples the conductive material 121 in the vias 120 to at least a portion of the integrated circuitry 103 (FIG. 1A) of the semiconductor dies 102 (e.g., to a first circuit of the integrated circuitry 103). The second conductive layer 134 electrically couples the optical components 110 to at least a portion of the integrated circuitry 103 of the semiconductor dies 102 (e.g., to a second circuit of the integrated circuitry 103).

In general, the connection layer 106 can be formed using a suitable metallization process as is well known in the art. For example, the metallization process can be a suitable process for forming layers of dielectric and conductive material on the substrates 104 of the semiconductor dies 102. The conductive layers 132, 134 can be traces, vias, etc., and can be made from, for example, copper, nickel, solder (e.g., SnAg-based solder), conductor-filled epoxy, and/or other electrically conductive materials. For example, as shown in FIG. 1B, the second conductive layers 134 can include a layer or trace portion 134a and a via or plug portion 134b electrically coupling the trace portion 134a to one of the optical components 110. The dielectric material 135 may be formed from, for example, parylene, polyimide, low temperature chemical vapor deposition (CVD) materials—such as tetraethylorthosilicate (TEOS), silicon nitride ($Si_3Ni_4$), silicon oxide ($SiO_2$)—and/or other suitable dielectric, non-conductive materials. In embodiments where the insulating layer 122 does not extend between the connection layer 106 and the conductive material 121, the dielectric material 135 can have a lower index of refraction than the conductive material 121 such that the dielectric material 135 at least partially acts as an optical waveguide for optical signals transmitted through the conductive material 121.

In operation, the vias 120 enable both optical signal transfer and electrical signal transfer (e.g., power delivery) between the semiconductor dies 102. That is, the vias 120 can carry optical signals (e.g. light) produced by the optical components 110 and/or from external components (not shown in FIGS. 1A and 1B), as well as electrical signals from a power source, a ground, or another source of electrical signals. It is expected that the vias 120 can carry optical signals simultaneously or substantially simultaneously as electrical signals without a degradation of either signal. Thus, by utilizing the same via structure for both optical and electrical signal transmission, the present technology can advantageously increase the signal density in a semiconductor device without increasing the number of communication lines (e.g., TSVs) in the device.

Figure 2A:
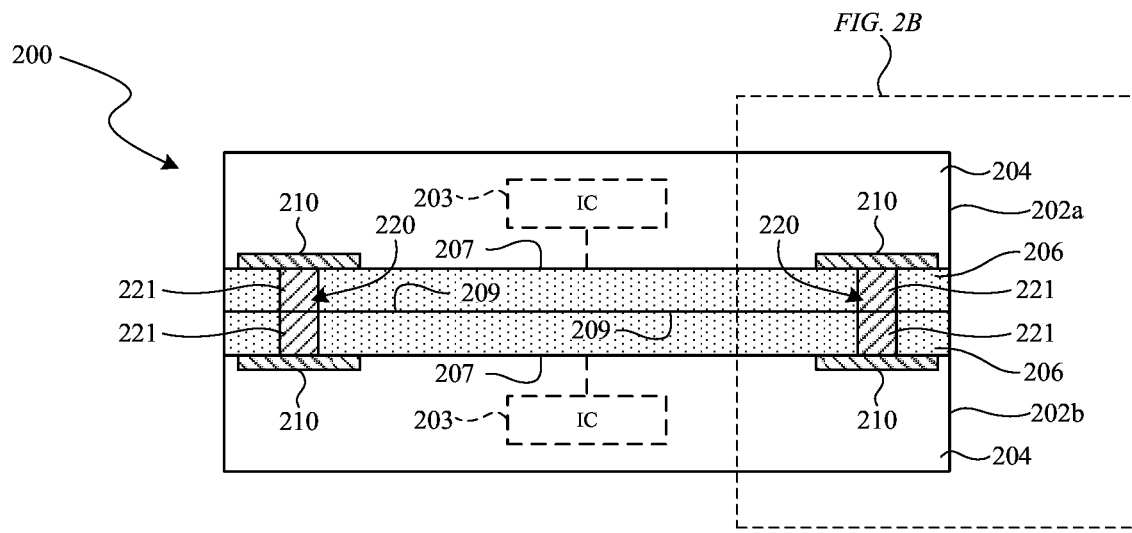
FIG. 2A is a cross-sectional view.

FIG. 2A is a cross-sectional view of a semiconductor device 200 having optically and electrically conductive vias configured in accordance with another embodiment of the present technology. This example more specifically shows two semiconductor dies arranged in a "front-to-front" configuration. The semiconductor device 200 can include features generally similar to those of the semiconductor device 100 described in detail above. For example, in the embodiment illustrated in FIG. 2A, the semiconductor device 200 includes a first semiconductor die 202a and a second semiconductor die 202b (collectively "semiconductor dies 202") adjacent to the first semiconductor die 202a. As shown, the semiconductor dies 202 can be arranged in a "front-to-front"

configuration (e.g., such that an active side of the first semiconductor die 202a faces an active side of the second semiconductor die 202b.) Each of the semiconductor dies 202 includes integrated circuitry 203, a substrate 204 (e.g., a silicon substrate), and a connection layer 206 on a surface of the substrate 204.

Figure 2B:
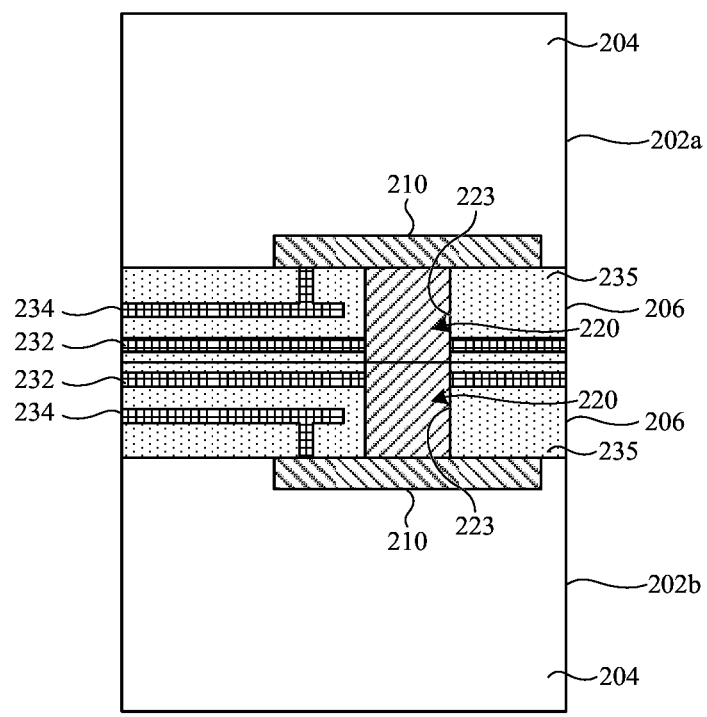
FIG. 2B is an enlarged cross-sectional view, of a semiconductor device in accordance with embodiments of the present technology.

As further illustrated in the embodiment of FIG. 2A, the connection layer 206 of each semiconductor die 202 can have a first side 207 proximate the substrate 204 and a second side 209 opposite the first side 207. Each of the semiconductor dies 202 includes vias 220 extending through the connection layer 206 from the first side 207 to the second side 209. More particularly, FIG. 2B is an enlarged cross-sectional view of a portion of the semiconductor device 200 showing an individual via 220 of the first semiconductor die 202a and an individual via 220 of the second semiconductor die 202b in accordance with an embodiment of the present technology. With reference to FIGS. 2A and 2B, the vias 220 each have a sidewall 223 that defines a cavity or opening filled with an optically and electrically conductive material 221 ("conductive material 221") such as, for example, indium tin oxide. As shown, the vias 220 of the first semiconductor die 202a are at least partially axially aligned with corresponding vias 220 of the second semiconductor die 202b such that the conductive material 221 extends substantially continuously between the semiconductor dies 202. The vias 220 can be formed using well known processes in the art. For example, the vias 220 can be formed using etching and deposition techniques as described above, or can be formed as part of the process for forming the connection layers 206 (e.g., by a suitable masking and plating process, or other additive process).

Each of the semiconductor dies 202 further includes optical components 210 optically coupled to corresponding ones of the vias 220. The optical components 210 can be optical transceivers, receivers, and/or transmitters that enable communication between the semiconductor dies 202, and/or between the semiconductor dies 202 and external circuitry. In the embodiment illustrated in FIGS. 2A and 2B, the optical components 210 can be axially aligned with corresponding ones of the vias 220. Accordingly, the semiconductor device 200 need not include waveguides, diffraction gratings, or other components for coupling the optical components 210 to the vias 220—rather, the optical components 210 are positioned to directly receive and/or transmit optical signals from/to the vias 220. More particularly, in some embodiments, a portion of the conductive material 221 (e.g., an end portion of the conductive material 221 proximate the first side 207 of the connection layer 206) can abut or nearly abut a corresponding one of the optical components 210.

The connection layer 206 of each the semiconductor dies 202 can include a (i) a first conductive layer 232 that electrically couples the conductive material 221 in the via 220 to at least a first portion of the integrated circuitry 203 (FIG. 2A) of the semiconductor dies 202; (ii) a second conductive layer 234 that electrically couples the optical components 210 to at least a second portion of the integrated circuitry 203 of the semiconductor dies 202; and (iii) a dielectric material 235 that electrically isolates the first conductive layer 232 and the second conductive layer 234 from each other. Moreover, in the embodiment illustrated in FIGS. 2A and 2B, the vias 220 do not extend through the substrate 204 of the semiconductor dies 202, so an insulating material need not be provided around the conductive material 221 in the vias 220. In some embodiments, the dielectric material 235 can be configured to facilitate the transmission of optical signals through the vias 220 by, for example, having a lower index of refraction than the conductive material 221 such that the dielectric material 235 at least partially acts as an optical waveguide for optical signals transmitted through the conductive material 221.

Figure 3:
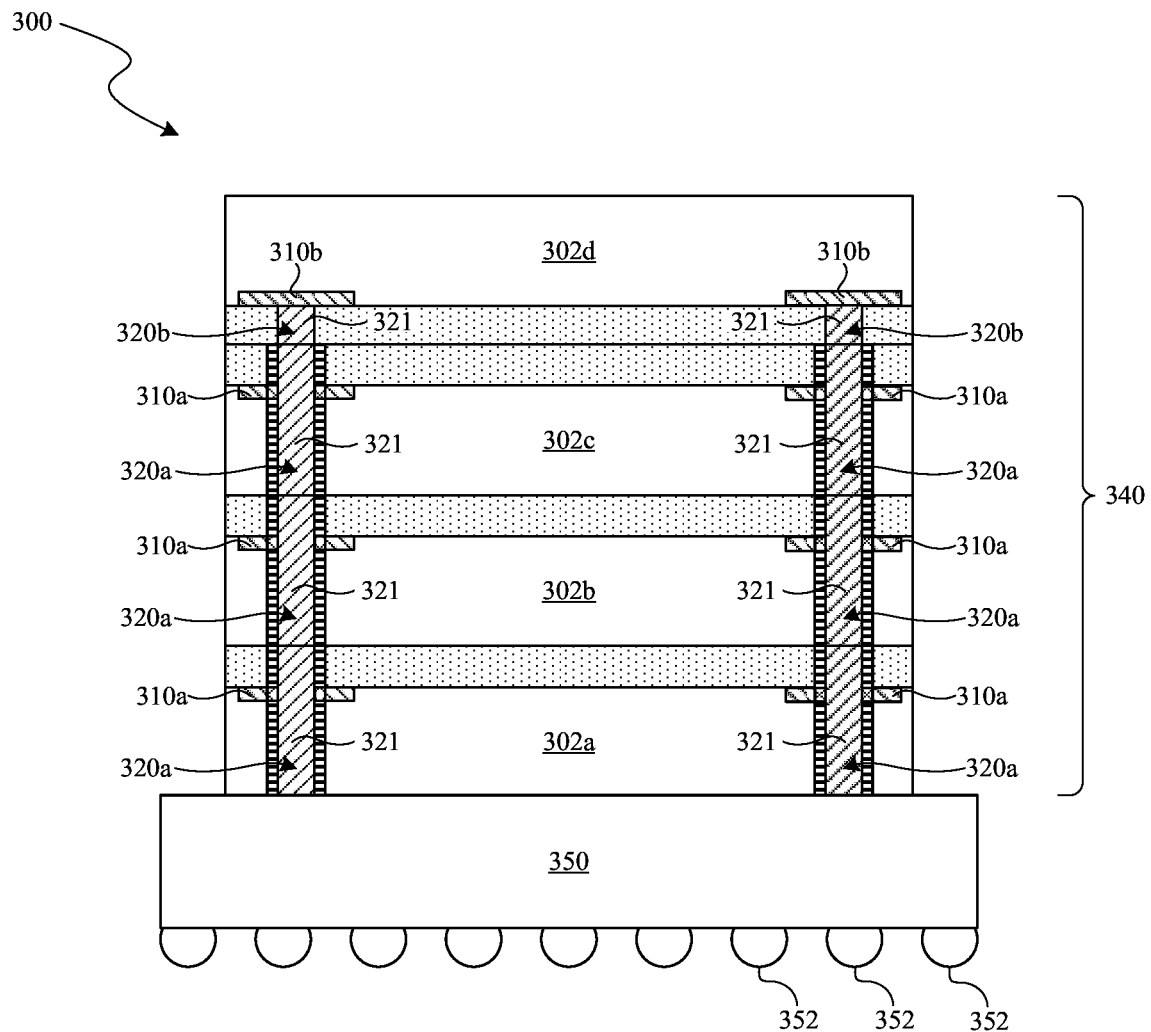
FIG. 3 is a cross-sectional view of a semiconductor device in accordance with another embodiment of the present technology.

FIG. 3 is a cross-sectional view illustrating a semiconductor device 300 in accordance with another embodiment of the present technology. This example more specifically shows a semiconductor device having more than two semiconductor dies arranged in more than one configuration. For example, in the embodiment illustrated in FIG. 3, the semiconductor device 300 includes a die stack 340 mounted to a package substrate 350. The die stack 340 includes a first semiconductor die 302a coupled to the package substrate 350, a second semiconductor die 302b coupled to (e.g., stacked over) the first semiconductor die 302a, a third semiconductor die 302c coupled to the second semiconductor die 302b, and a fourth semiconductor die 302d coupled to the third semiconductor die 302c (collectively "semiconductor dies 302a-302d").

As shown, the first semiconductor die 302a and the second semiconductor die 302b can be arranged in a "back-to-front" configuration. The second semiconductor die 302b and the third semiconductor die 302c can likewise be arranged in a "back-to-front" configuration. Accordingly, in some embodiments, the first semiconductor die 302a, the second semiconductor die 302b, and the third semiconductor die 302c (collectively "semiconductor dies 302a-302c") can have features generally similar to (e.g., the same as) the semiconductor dies 102 illustrated in the embodiment shown in FIGS. 1A and 1B. For example, each of the semiconductor dies 302a-302c can include vias 320a extending entirely therethrough, and the vias 320a can have an optically and electrically conductive material 321 ("conductive material 321") disposed therein. Each of the semiconductor dies 302a-302c can further include optical components 310a optically coupled to corresponding ones of the vias 320a.

As further illustrated in the embodiment of FIG. 3, the third semiconductor die 302c and the fourth semiconductor die 302d are arranged in a "front-to-front" configuration. Accordingly, in some embodiments, the fourth semiconductor die 302d can have features generally similar to (e.g., the same as) the semiconductor dies 202 illustrated in the embodiment shown in FIGS. 2A and 2B. For example, the fourth semiconductor die 302d can include vias 320b extending only partially therethrough (e.g., through a connection layer of the fourth semiconductor die 302d) and having the conductive material 321 disposed therein. Moreover, the fourth semiconductor die 302d includes optical components 310b optically coupled to corresponding ones of the vias 320b.

As shown, the vias 320a of the semiconductor dies 302a-302c can be aligned (e.g., axially aligned) with each other and with the vias 320b of the fourth semiconductor die 302d such that the conductive material 321 in the vias extends substantially continuously through the die stack 340 to electrically and optically couple the semiconductor dies 302a-302d. Moreover, in some embodiments, the vias 320a of the first semiconductor die 302a can be electrically and/or optically coupled to the package substrate 350. The package substrate 350 can include a redistribution layer, an interposer, a printed circuit board, a dielectric spacer, another semiconductor die (e.g., a logic die), or another suitable substrate. The package substrate 350 can further include electrical connectors 352 (e.g., solder balls, conductive bumps, conductive pillars, conductive epoxies, and/or other suitable electrically conductive elements) electrically coupled to the package substrate 350 and configured to electrically couple the semiconductor dies 302a-302d to external devices or circuitry (not shown). For example, in certain embodiments, the vias 320a and 320b can be electrically coupled to an external power source or a ground through the package substrate 350.

In some embodiments, the package substrate 350 can include components (e.g., fiber optic components, waveguides, etc.) for routing optical signals between the semiconductor dies 302a-302d and external devices or circuitry. In certain embodiments, the package substrate 350 can additionally or alternatively include one or more optical components optically coupled to the conductive material 321 in the vias. For example, the package substrate 350 can include optical transceivers, photodiodes, and/or LEDs for transmitting and/or receiving optical signals to/from the semiconductor dies 302a-302d.

In other embodiments of the present technology, a semiconductor device including a die stack with more than two dies, and optically and electrically conductive vias extending through the die stack, can be provided using any of the front-to-back or front-to-front arrangements described herein with reference to FIGS. 1A-3, or any combinations thereof. For example, a semiconductor device according to the present technology can include multiple front-to-front pairs of semiconductor dies stacked 4-high, 6-high, 8-high, etc., multiple front-to-back pairs of semiconductor dies stacked 4-high, 6-high, 8-high, etc., or any other combination.

Figure 4:
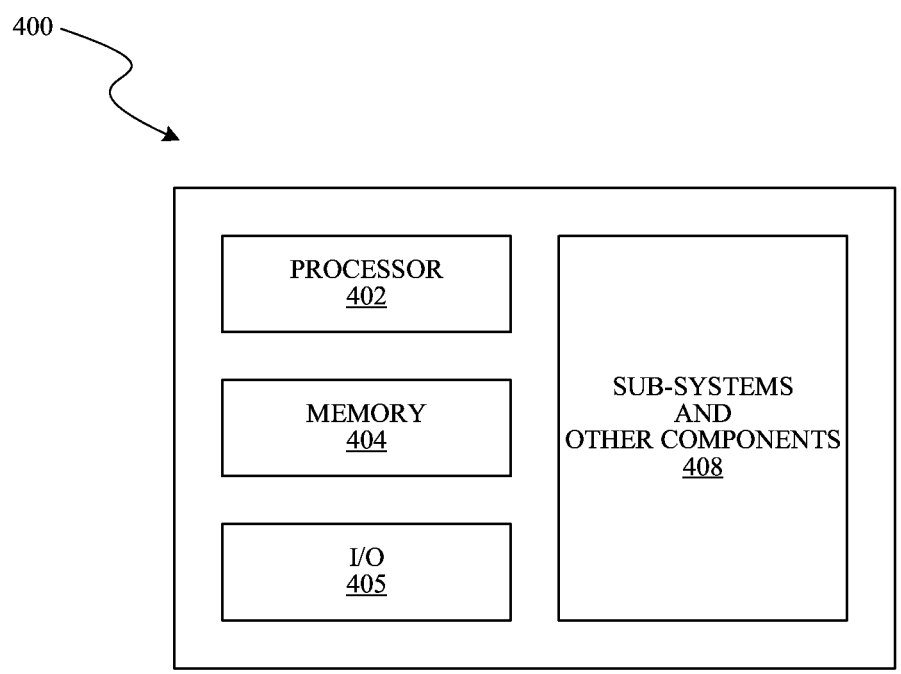
FIG. 4 is a schematic view of a system that includes a semiconductor device configured in accordance with embodiments of the present technology.

Any one of the semiconductor devices having the features described above with reference to FIGS. 1A-3 can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 405, and/or other subsystems or components 408. The semiconductor devices described above with reference to FIGS. 1A-3 can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 400 include lights, cameras, vehicles, etc. With regard to these and other example, the system 400 can be housed in a single unit or distributed over multiple interconnected units, e.g., through a communication network. The components of the system 400 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
a first semiconductor die having a first optical component and a first via;
a second semiconductor die having a second optical component and a second via; and
an optically and electrically conductive material in the first via and in the second via, wherein the optically and electrically conductive material forms a continuous optical path extending between the first and second semiconductor dies, and wherein the optical path optically couples the first and second optical components.

2. The semiconductor device of claim 1 wherein the optical path further includes—
a first optical element coupled between the first optical component and the optically and electrically conductive material; and
a second optical element coupled between the second optical component and the optically and electrically conductive material.

3. The semiconductor device of claim 1 wherein the first optical component is an active optical component, wherein the second optical component is a passive optical component, and wherein the active optical component is configured to generate light signals for transmission to the passive optical component via the optical path.

4. The semiconductor device of claim 1 wherein the optical path includes a waveguide for routing light signals at least partially between the first and second optical components.

5. The semiconductor device of claim 1 wherein the optical path defines an axis, and wherein the first and second optical components are axially aligned with the axis.

6. The semiconductor device of claim 1 wherein the first and second optical components are optical transceivers formed from a semiconductor material.

7. The semiconductor device of claim 1, further comprising a package substrate coupled to the first and second semiconductor dies, wherein the optical path (a) extends between the first and second semiconductors and the package substrate and (b) optically couples the first and second semiconductors to the package substrate.

8. The semiconductor device of claim 1 wherein the optically and electrically conductive material is indium tin oxide.

9. The semiconductor device of claim 1 wherein the optically and electrically conductive material includes a first portion in the first via and a second portion in the second via, and wherein the first portion abuts the second portion such that the first portion is optically and electrically connected to the second portion.

10. The semiconductor device of claim 2 wherein the first and second optical elements are at least one of a waveguide or a diffraction grating.

11. The semiconductor device of claim 2, further comprising an insulating material positioned at least partially around the optically and electrically conductive material, wherein the insulating material has a lower index of refraction than the optically and electrically conductive material such that the insulating material at least partially acts as an optical waveguide for light signals transmitted through the optically and electrically conductive material.

12. The semiconductor device of claim 8 wherein the package substrate includes a waveguide for routing light signals from the first and second optical components to at least one external circuit.

13. The semiconductor device of claim 9 wherein the first semiconductor die is stacked over the second semiconductor die such that a lower surface of the first semiconductor die faces an upper surface of the second semiconductor die, and wherein the first portion abuts the second portion proximate to the lower surface of the first semiconductor die and proximate to the upper surface of the second semiconductor die.

14. A semiconductor device, comprising:
a first semiconductor die having a first optical component;
a second semiconductor die having a second optical component; and
an optical path extending continuously between the first and second semiconductor dies, wherein the optical path optically couples the first and second optical components, wherein at least a portion of the optical path includes an optically and electrically conductive material, wherein the optical path defines an axis, and wherein the first and second optical components are positioned off the axis.

15. A semiconductor device, comprising:
a first semiconductor die having a first via;
a second semiconductor die having a second via; and
an optically and electrcially conductive material in the first via and in the second via, wherein the optically and electrically conductive material forms a continuous optical and electrical path extending between the first and second semiconductor dies, and wherein the optical and electrical path (a) optically couples the first and second semiconductor dies and (b) electrically couples the first and second semiconductor dies.

16. The semiconductor device of claim 15 wherein the first semiconductor die includes an active optical component optically coupled to the optical and electrical path, wherein the second semiconductor die includes a passive optical component optically coupled to the optical and electrical path, and wherein the active optical component is configured to generate light signals for transmission to the passive optical component via the optical and electrical path.

17. The semiconductor device of claim 15 wherein the first semiconductor die includes a first optical transceiver optically coupled to the optical and electrical path, wherein the second semiconductor die includes a second optical transceiver optically coupled to the optical and electrical path, and wherein the first and second optical transceivers are each configured to (a) generate light signals for transmission via the optical and electrical path and (b) receive transmitted light signals via the optical and electrical path.

18. The semiconductor device of claim 15 wherein the common optical and electrical path includes a waveguide portion.

19. The semiconductor device of claim 14 wherein the optically and electrically conductive material includes a first portion in the first via and a second portion in the second via, and wherein the first portion abuts the second portion such that the first portion is optically and electrically connected to the second portion.

20. A semiconductor device, comprising:
a stack of semiconductor dies, wherein each of the semiconductor dies includes a via; and
an optically and electrically conductive material in the vias, wherein the optically and electrically conductive material forms a continuous optical and electrical path extending between the semiconductor dies, and wherein the optical and electrical path both optically and electrically couples the semiconductor dies.

21. The semiconductor device of claim 20, further comprising a package substrate configured to carry the stack of semiconductor dies, wherein the package substrate is (a) optically coupled to the optical and electrical path and (b) electrically coupled to the optical and electrical path.

* * * * *